United States Patent
Szász et al.

(10) Patent No.: US 7,827,010 B2
(45) Date of Patent: Nov. 2, 2010

(54) DEVICE AND PROCESS FOR EXAMINING THE SIGNALS OF SYSTEMS RELEASING THEM DURING OPERATION OR IN RESPONSE TO EXTERNAL EXCITATION

(75) Inventors: Nóra Szász, Páty (HU); Olivér Szász, Páty (HU)

(73) Assignee: XAX Kft., Budapest (HU)

( * ) Notice: Subject to any disclaimer, the term of this patent is extended or adjusted under 35 U.S.C. 154(b) by 337 days.

(21) Appl. No.: 11/783,960

(22) Filed: Apr. 13, 2007

(65) Prior Publication Data

US 2008/0162087 A1    Jul. 3, 2008

(30) Foreign Application Priority Data

Oct. 15, 2004   (HU)   ..................... 0402087
Oct. 12, 2005   (HU)   ..................... 0500944

(51) Int. Cl.
*H03F 1/26*   (2006.01)
(52) U.S. Cl. ..................................... 702/189
(58) Field of Classification Search .................. 702/189
See application file for complete search history.

(56) References Cited

U.S. PATENT DOCUMENTS 5,293,555 A * 3/1994 Anthony ...................... 702/36
5,774,379 A 6/1998 Gross et al.
5,888,374 A 3/1999 Pope et al.
6,170,334 B1 * 1/2001 Paulson ...................... 73/587
6,526,356 B1 2/2003 DiMaggio et al.
6,779,404 B1 8/2004 Brincker et al.

FOREIGN PATENT DOCUMENTS

| EP | 0 623 816 A2 | 11/1994 |
|---|---|---|
| EP | 0 889 315 A2 | 1/1999 |
| GB | 1 397 334 | 6/1975 |
| JP | 2004215854 | 8/2004 |
| WO | 02/095633 | 11/2002 |

* cited by examiner

*Primary Examiner*—Aditya Bhat
(74) *Attorney, Agent, or Firm*—Young & Thompson (57) ABSTRACT

Method and a measuring device for measuring and evaluating a measurable signal emitted by a system being investigated during operation or in response to an external excitation. The device includes a signal receiving unit, an output unit and an evaluating unit. The latter includes elements for Fourier transforming the time dependant signal captured by the receiving unit and characteristic of the system as a whole, the signal is transformed directly in its captured form; elements for calculating the power density function of the Fourier transform; elements for calculating an invariant quantity in the form of the exponent α of the power density function versus the frequency, as well as elements for providing data indicative of the invariant quantity obtained to the output unit.

22 Claims, 6 Drawing Sheets

DEVICE AND PROCESS FOR EXAMINING THE SIGNALS OF SYSTEMS RELEASING THEM DURING OPERATION OR IN RESPONSE TO EXTERNAL EXCITATION

CROSS-REFERENCES TO RELATED APPLICATIONS

The present application claims priority to and incorporates by reference PCT/HU2005/000115 filed Oct. 13, 2005, Hungarian Patent Application P0402087 filed Oct. 15, 2004 and Hungarian Patent Application P0500944 filed Oct. 12, 2005.

FIELD OF THE INVENTION

The present invention relates to a device and a method for the direct measurement of the actual properties/condition of a complex system as a whole and also for the monitoring of its condition's evolution. In particular, the invention refers to a device and a method to be used in the course of planning processes, wearing tests and qualitative examination, and applicable to the noise measurement of systems producing measurable signals during operation or in response to external excitations applied thereon.

BACKGROUND OF THE INVENTION

The test of wearing and tearing is of vital importance in the respect of preventive maintenance and operation life. The problem is rather complex and complicated as one has to conclude on the properties of the given equipment from the results of type tests, and also the characteristic values of the type in question should be specified by using the operation data of several single devices. This problem can be practically traced back to a single root: the used systems are open and connected to their environment through a number of elements, as well as they can not be considered as closed systems even for the duration of measurement. They form an open system from an energetic point of view (energy exchange with the environment, having the characteristic values of energy input (feeding) and energy take out (useful effect), non-deprivable substantial characteristics) because of the interactions indispensable for the operation (on which the effect of the system is directed, retroactive effects) and owing to the influences of environment (environmental loads, e.g. temperature, contamination, pressure, rain etc.), as well as on account of the user's habits and conditions (e.g. early morning usage, usual usage order, effects of usual intensity, direction etc.). Relying upon these characteristics the measured values are to be handled according to the rules of fuzzy logic, and the multitude of interactions might make impossible the parametric distribution hypotheses (e.g. Kaplan-Meier non-(semi)-parametric lifetime evaluation).

Dynamical effects and changes are noise-free only in the case of very simple and reversible cases (for energetically closed systems). This is practically a theoretical idealization, because in reality the noise is always present as the fluctuation of the given signal (measured, set, used etc.) (Robinson F N H: Noise and Fluctuations, Clarendon Press, Oxford, 1974; and Freeman J J: Principles of Noise, John Wiley & Sons, Inc. 1958).

The noise/fluctuation source is composed of versatile interactions, continuous energy and entropy/information exchange of open dynamical systems and mutual dependence of individual subsystems, and the actual noise spectrum is formed in a synergetic way (Reif F: Statistical and Thermal Physics, McGraw Hill, New York, 1965). Consequently, the desired effect is accompanied in every real case by the noise/fluctuation spectrum composed of the specific features of the dynamical system. Thus, the noise/fluctuation is a form of appearance of parameters, processes, dynamical behaviour etc. always arising, but not directly involved in a given examination. Furthermore, the noise/fluctuations provide information on the (internal and/or external) interactions of the system under study.

In the course of usual wearing tests and quality examinations, each element of the system is examined separately by using several sensors, and during the measurement one tries to eliminate or minimize the noise. Consequently, the aim at these measurement procedures is to filter the noise and create the best possible signal-to-noise ratio in order to get the most exact information possible regarding the given subsystem.

There are two fundamental strategies for the elimination of noises:
  All the possible interactions are fixed and the dynamics of their changes is restricted as much as possible and handled merely as a static condition (filtering with fixed parameter).
  The dynamical interaction is accepted as the source of noise, however, it is separated from the "useful" signal to be examined by applying filtering mechanisms (lock-in type filtering).

In the case of open, dissipative systems (basically every occurrence realizing not spontaneous thermodynamical changes, e.g. heat engines, biological systems, electromagnetic radiators etc.) the reduction of noise is impossible by fixing the interactions, because the open, dissipative feature assumes the definite interaction with the environment. For this reason, at the real, irreversible dynamical systems only the second possibility could be considered, namely, noise has to be taken into account and—at the most—the dynamical methods applied may suppress it and bring out the "useful" signal as far as possible.

It has been realised that certain parts of the noise spectrum can carry information relevant for monitoring the condition of a system and this information is best obtained from the Fourier transform of a measured signal of the system. However, known methods only allow for an indirect detection of very special faults or failures of the monitored system. For example, U.S. Pat. No. 5,888,374 relates to an apparatus and method for monitoring localised pitting corrosion in metal pipes or storage vessels. Here, electrochemical probes are used for sensing electrochemical noise voltage values and electrochemical noise current values at various locations within the medium contained by the metal pipes or storage vessels under study in the vicinity of their walls. To predict the extent and rate of pitting corrosion, the data obtained in this manner are subjected to electrochemical noise analysis, wherein the high frequency part of the noise spectrum is simply screened out by calculating the root-mean-square values of the measured electrochemical voltage and current noise data prior to applying the Fourier transform. This is done as pitting corrosion is characterised by very low frequencies and high frequency noise is attributed to general corrosion. As a result of this "averaging", however, a part of the interactions and their global effects (i.e. general corrosion) on the system under study is also screened out. This means that the result obtained as the slope of the power spectral density versus frequency is a characteristic measure of not the system as a whole but only of a subsystem with reduced (i.e. at least partially screened out) interactions.

A further important characteristics of the method and apparatus disclosed in U.S. Pat. No. 5,888,374 is that the actual measuring takes place with the probes (made of the same material as the pipes and of a further non-corroding material, for reference) and not directly with the pipes and storage vessels, that is with the system of interest. Or alternatively, the monitoring process of U.S. Pat. No. 5,888,374 is an indirect process, wherein certain conclusions are drawn with respect to the corrosion condition of the pipes and storage vessels from data measured actually with the electrochemical probes (and not with the pipes and storage vessels themselves) arranged in the vicinity of the pipes and storage vessels.

OBJECT OF THE INVENTION

In view of the above, a need exists for providing a device and method for the direct detection or prediction of general failures or weaknesses of an arbitrary system, as a whole and in its entirety, from a measurable signal released by the system itself during operation or on the effect of external excitation.

SUMMARY OF THE INVENTION

The concept of the invention is based on the recognition that the whole dynamics is included in the noise/fluctuations, and practically all those dynamical variables appear therein, the interactions of which have a share in the creation of the given (desired/useful) signal. Moreover, the noise/fluctuation spectrum gives account of the correlations within the system. Therefore, the system can be examined as a whole and in its entirety, and the system operation can be analysed on basis of its noise spectrum. All the failures arising because of wearing, tearing and fatigue processes (in general through stochastical changes) result in the continuous change of the noise spectrum. Each systematic change due to wearing processes or incompatibility problems arising at a given moment is effecting the evolution at a second given moment, which means that it can be deduced in a recursive manner (Markov chains). This recursive behaviour is what gives rise to the systematic fluctuations making it a universal characteristic of the system. If the system characteristics at a given moment depend only on the previous moment, the system's fluctuation behaviour can be best described by the Brown-motion parameters and the Brown-noise. However, if complexity of the system defines long distance correlations within the system, the noise (as a characteristic of the entire system) is more similar to other coloured noises, in ideal cases to pink noise, which can be described by an 1/f function of the frequency. Therefore, recording of the noise spectrum allows the prediction of the wearing and tearing (fatigue etc.) processes. The length of the time period that can be considered as the "unit" of the recursive progress is determined by the characteristic frequencies of the given system. It is recommended, but not compulsory, to choose a unit frequency which is in the same order as the system's characteristic frequency in a given examination type. Furthermore, by mapping the noise spectrum recorded, i.e. by calculating e.g. the Fourier transform thereof and investigating the frequency dependence of the power density constructed in terms of said Fourier transform of the noise spectrum, a few (in most cases only one) invariant integral parameters can be deduced that fully characterise the noise and hence the system itself under study.

The aim of the invention is to provide a device and a method by means of which information can be obtained on the dynamics of a complex system as a whole and in its entirety in order to be used for planning processes and qualitative examinations. Further aims of the invention will be apparent from the detailed description of the various embodiments and the Examples.

Hence, according to a first aspect of the invention a measuring device for measuring and evaluating a measurable signal emitted by a system being investigated during operation or in response to an external excitation is provided. Said device comprises a signal receiving unit, an output unit and an evaluating unit, wherein the evaluating unit comprises means for Fourier transforming the time dependant signal captured by the receiving unit and characteristic of the system as a whole, wherein the signal is transformed directly in its captured form, that is, no further operations are performed thereon, means for calculating the power density function of the Fourier transform, means for calculating an invariant quantity in the form of the exponent $\alpha$ of the power density function versus the frequency, means for providing data indicative of the invariant quantity obtained to the output unit.

According to a second aspect of the invention a method for measuring and evaluating a measurable signal emitted by a system being investigated during operation or in response to an external excitation is provided. The method comprises the steps of capturing the system's time dependant signal characteristic of the system as a whole, evaluating said signal comprising Fourier transforming said signal in its captured form (i.e. with no further operations performed thereon), calculating the power density function of the Fourier transform and calculating an invariant quantity in the form of the exponent $\alpha$ of said power density function versus the frequency, and transmitting said invariant quantity to further processing.

In view of the above, such a measuring device and method are provided that are suitable for investigating a given system as a whole and in its entirety on basis of a characteristic feature thereof, namely the noise spectrum containing all the effects of the system's internal interactions (i.e. taking place amongst the various subsystems building up the system itself and the system's external interactions (i.e. between the system and its environment) in operation.

As is clear, the present invention makes possible not only to evaluate the actual status of a system under study or check its aging stage, but it also gives predictions for future developments thereof. The evaluation of the trend of the integral parameters, that is, the fitted slopes, makes possible to prepare for the actual maintenance in time, when the given device is working properly yet. The invention makes possible to guess the aging dynamics, e.g. the acceleration or slowing down of the aging process by the actual intervention or service. The prediction made by the invention targets the expected events in the future, and does not limit the investigation to determine only the actual characteristics. Furthermore, the predictive feature of the invented method allows the immediate check of the long-term "harmony" of the replacements (details, parts, etc.) at the actual repair, to avoid the common problem of their long-term incompatibility with further parts of the system repaired, despite of their proper work as separate individual units.

Further advantageous embodiments of the device and the method according to the invention are described in the dependent claims.

It is to be noted that noise measurement, that is the measurement of a system's noise/fluctuations, should be understood as measuring an output signal of the system without applying noise filtering on the output signal. Thus the measured signal is made up of the useful signal (in certain cases including the characteristic frequencies) and the noise superposed thereupon. It can be easily shown that the useful signal (or the characteristic frequencies as the case may be) only appears with a minimal weight in the Fourier transform of the signal, since in an ideal case periodic signals are mapped into one single point of the Fourier space. As it will be apparent, practically only the noise part of the whole output signal will be analysed during the examination, hence the method of the invention will be referred to as "noise measurement".

In the context of the present invention noise measurement of a given process means measuring the time dependence of either an electric, or a mechanic, or other measurable signal. The concept of the invention is that—as opposed to the known solutions—the noise is not filtered, but on the contrary, the noise itself is investigated, because it provides the valuable part of the signal. Namely, the inventors have observed that the spectrum of the noise measurable in any physical parameter (namely, the Fourier transform of the noise signal) shows a typical collective characteristic: it depends on the frequency as a power function. The exponent of the power function is measured, which can be regarded as an invariant quantity typical to the dynamics of the system as a whole, and this is used for the observation of system dynamics. Therefore, this measured value serves as a parameter of the properties, not of the single noises (information from the observation of individual frequencies), but of the system as a whole (features of the whole frequency spectrum) which, as such, is able to sensitively characterise the changes taking place in the dynamics of the system. Consequently, the monitoring of this parameter may replace the multisensor observation of complex systems by incorporating the actual status of the system into a single invariant and integral parameter. Accordingly, this parameter is technically suitable for

- making observations regarding the state of system completeness by means of using the parameter, as a reference, predetermined for the system of proper operation;
- replacing a complicated scheme of multisensor observations (however, for observations for specifying the place of fault, local sensors should be used, but in measurement groups of more integration, as without the use of the method according to the present invention);
- forecasting the trends indicating possible faults;
- observing the trend of system wearing-out (lifetime);
- measuring to what extent a uniform dynamical load is assured by using the parameter during development;
- exploring the "unusual", sudden changes, usage faults and unauthorized usage (e.g. when a non-qualified person intervenes and modifies said invariant quantity even if it does not result in an operation fault, e.g. manual gearbox of cars).
- measuring the trend of evolution for control and documentation purposes and demonstrating the efficiency of the renovation or upgrade in the course of general renovation and upgrading of the system. This can also be an efficient way of screening and warding off inherent incompatibility problems.

BRIEF DESCRIPTION OF THE DRAWINGS

Active screening can be applied to the system to be examined by which faults and errors can be detected more accurately and specifically; the source of the failure and the resonance points can be localised and warded off. Further details of the invention will be apparent from the following embodiments with reference to the accompanying drawings, in which.

DETAILED DESCRIPTION OF THE INVENTION

Figure 1:
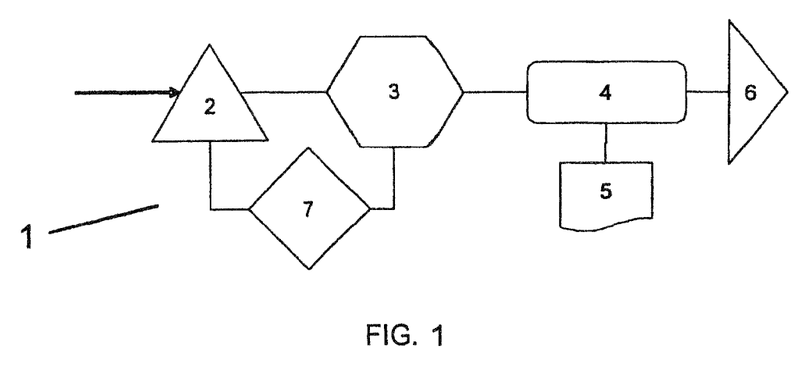
FIG. 1 is a block diagram of one of the embodiments of noise measuring unit according to the invention.

FIG. 1 is a block diagram of an embodiment of a noise measuring device 1 according to the invention. At the input of the device 1 is a measuring unit 2. As the most simple solution is to trace back the noise measurement to the measurement of voltage or current, consequently, the measuring unit 2 usually works as a voltage and/or a current measuring unit. In certain cases, the measuring unit 2 can be supplied with an appropriate transforming unit for the transformation of non-voltage or non-current type signals (e.g. mechanical vibration) to voltage or current signals. The measuring limit of the measuring unit 2 is determined by the operating range of the actual equipment to be examined, while the accuracy depends on the type of the actual noise. The measuring unit 2 is directly connected to a fast Fourier analyser 3. Under laboratory conditions, an oscilloscope or spectrum analysers can be used as the measuring unit 2. The latter ones can be provided with a built-in FFT function, and in this case there is no need to have a built-in analyser 3 in the system.

The output of the analyser 3 is connected to a data processing equipment, preferably to a computer 4, with a software installed for the direct evaluation of the noise measurement results. Display unit 5 (e.g. a monitor) or an actuating unit 6 can be connected to the computer 4. Here, the latter one reacts upon the operation of the system depending on the evaluated results, and can work as a control unit. The regulating action can be off-line (human interventions after the displayed result), however, based on the measured parameters an on-line or a real time actuating unit 6 can be advantageously used. Both the display unit 5 and the actuating unit 6 can be omitted, however, an element that can be regarded as an output unit is necessary, otherwise the measuring device 1 would be useless to measure the invariant quantity, that is the exponent $\alpha$, characteristic of the system examined. Furthermore, the resulting $\alpha$ value has to be transmitted via an appropriate output unit to an operator or a serviceman. For example, the $\alpha$ value can be displayed via the display unit 5, or in other embodiments the output means can be a telecommunication device, e.g. an Internet port which transmits the information to the computer of a distant user. Another option could be that the output unit performs automatic control of the system examined. For example, in case of an electrical amplifying unit, the position of a rotary capacitor could be adjusted by means of the actuating unit 6, as shall be evident later on.

The analyser 3 and the computer 4 of the measuring device 1 can be integrated into one element. For example the analyser 3 can be a software part of the computer 4, it could even be part of the software evaluating the results of the noise measurement. Instead of using a computer as the measuring device 1 it can be integrated into a "one-chip PC" having A/D converter, which could also perform the function of the analyser 3 and could be adapted to receive and evaluate the signal transmitted by the measuring unit 2 and to calculate the α exponent.

The noise measuring unit 2 may have an independent power-supply unit 7, which is not compulsory, but it can be advantageous in case of certain measurements.

In general applications a signal appearing at a certain part of the system can be measured by means of the measuring unit 2 connected to the system (in certain cases this unit transforms the system's signal into voltage or current signal). The analyser 3 measures the time dependant signal h(t), and transforms it into the Fourier space by applying e.g. fast Fourier transformation, that is, transmits frequency-dependent discrete values h(f) to the computer 4. (Of course, the fast Fourier transformation is not the only possible tool for effecting the required transformation, however, this method is suitable for the accomplishment of real time evaluation.) The signal processing software raises the frequency-dependent Fourier transformed noise values h(f) to the second power and divides it by the effective frequency band-width Δf, which is simply the width of the frequency window used for performing the fast Fourier transformation. In this way the $$S(f)=|h(f)\cdot h(f)^*|^2/\Delta f$$

power density function is obtained.

As mentioned earlier, according to the observation of the inventors the power density S(f) depends on the frequency accordant to an S(f)~$f^\alpha$ power function, and the exponent α is suitable for the characterization of the collective dynamical behaviour of the examined system as a whole and in its entirety. If the construction of the system is ideal, the correlation lengths are of infinite extent, and in this case the noise spectrum is harmonic, that is S(f)~1/f, and hence α=−1. Also, the inventors have found that in case of devices operating optimally the value of α was constant and practically independent of the operating conditions. It was also found that the value of α remained the same or only negligibly (i.e. within the error limit) changed, until the system under study was maintaining its optimal operation. Accordingly, one has to examine two aspects in the course of planning processes, wearing and quality tests: how the invariant value, i.e. the α exponent, measured for a given system approximates the ideal value of minus 1 [from now on (−1)], and how as well as to what extent from its initially measured value it changes when modifying the operating conditions.

For the illustration of the operation of the device and method according to the invention, results of noise measurements carried out on exemplary systems will now be shown.

EXAMPLE 1

Figure 2:
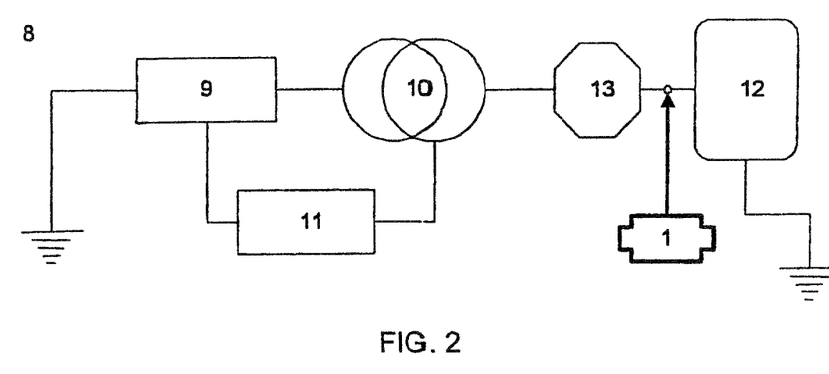
FIG. 2 is a block diagram of a tested radio-frequency amplifier.

By using a device 1 according to the invention the noise of a high-performance, controlled, radio-frequency (RF) amplifying unit 8 was measured, which can be seen on the schematic drawing of FIG. 2. The amplifying unit 8 is composed of a quartz-crystal pre-amplifier 9 operating at 13.56 MHz and a connected RF amplifier of high noise suppression (minimum 60 dB), both of which are supplied with controlled power supply unit 11. Between the external load 12 and the RF amplifier 10 a matching device 13 of 50 Ohm is inserted. For the noise measurement, the device 1 was arranged between the load 12 and the matching device 13, and the measurement of the appearing signal was carried out by using a measuring unit 2 (in this case a voltage measuring unit).

Figure 3:
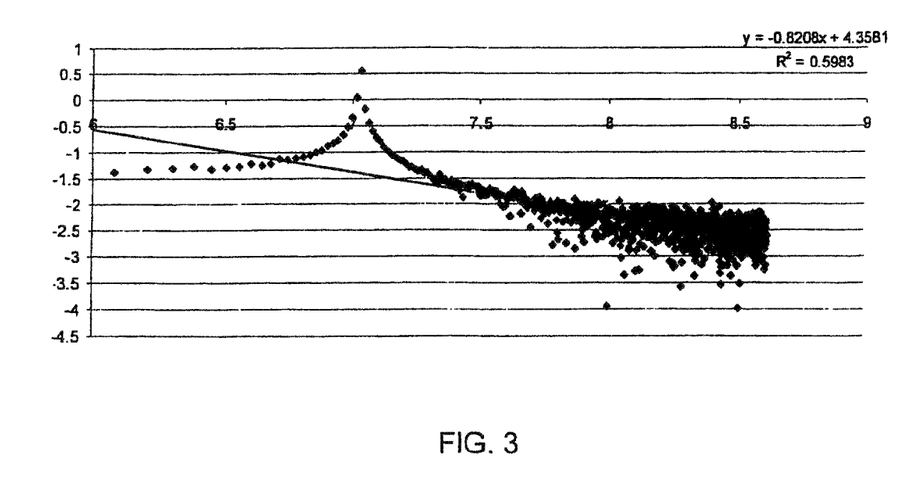
FIG. 3 shows the result of a noise measurement carried out on a radio-frequency amplifier.

In FIG. 3 the logarithm of the above defined power density function S(f) is illustrated as a function of the logarithm of the frequency, and a straight line (a linear function) is fitted on the obtained measurement points. In this case the slope of the line fitted, i.e. the exponent α characteristic of the measured system as a whole equals to −0.8208 and the accuracy of fitting is 0.5983. It should be noted that the maximum value corresponds to the 13.56 MHz primary frequency, that is, to the operation frequency of the pre-amplifier 9. The characteristic frequencies and the operating frequencies of the examined system (in this case the amplifying unit 8) are always present in the measurement results, however, the number of points falling into this range is relatively few as compared to the points forming the basis of the best-fit line, therefore the fitting of a line can be considered as justified and reasonable. For the exact calculation of the exponent α in question the average of several measurements are taken.

EXAMPLE 2

In the course of this experiment the exponent α of the amplifying unit 8 described in Example 1 was tested before and after maintenance under different operating conditions. The measurement results are summarized in FIG. 4. Labels EG1, EG2, EG3 show the obtained results at the output powers of 50 W, 100 W, 150 W, respectively, with a pure resistance load. The same α values obtained for complex loads are indicated by the labels EB1, EB2, EB3. All points of the diagram are calculated as the average of five measurement results and the deviation from the average is indicated by the vertical error bars. Here, 1024 points per measurement were adopted, and after fitting on this set of points the indicated values of exponents α were obtained.

Figure 4:
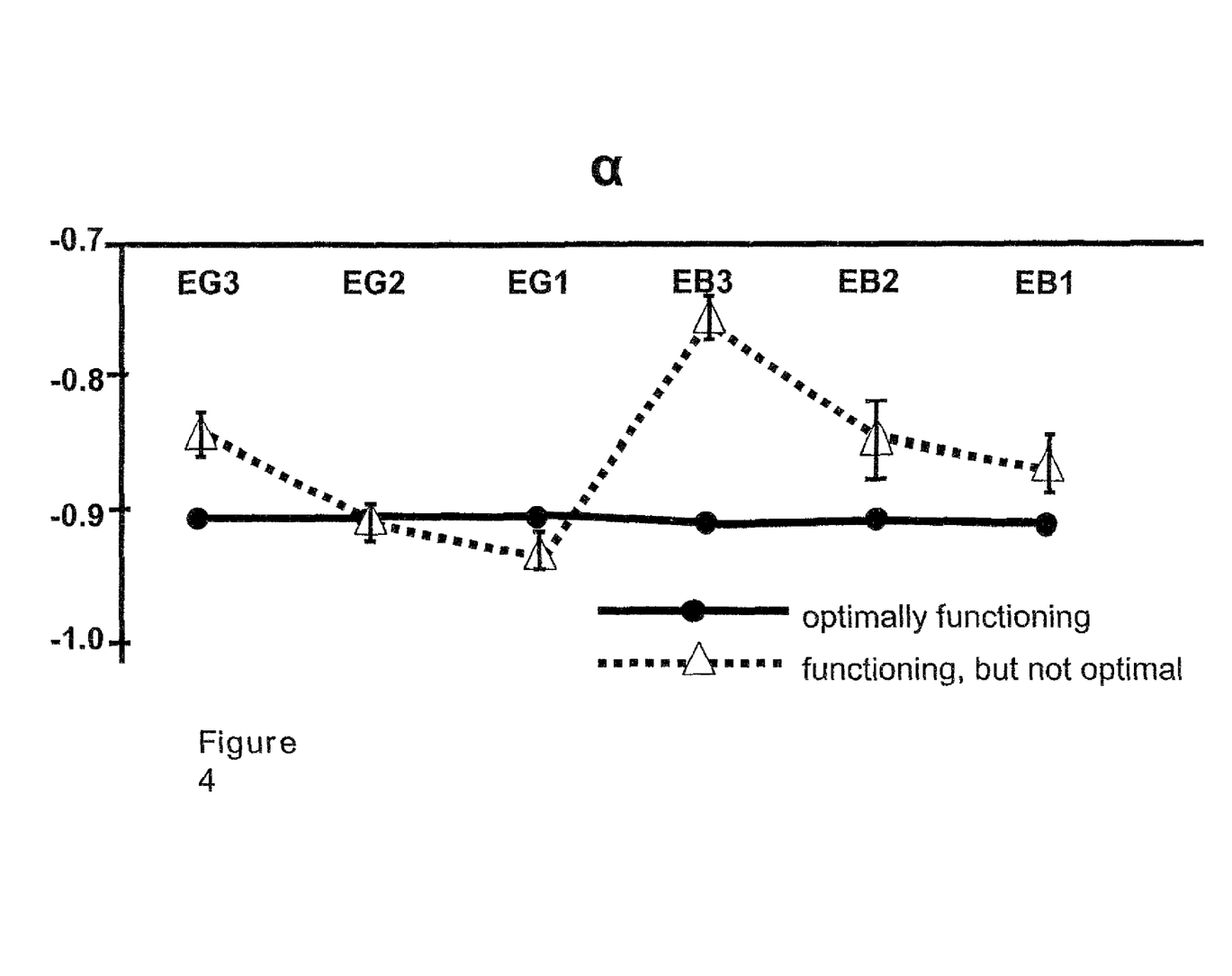
FIG. 4 illustrates the result of a noise measurement carried out on two radio-frequency amplifiers under different conditions.

As can be seen, the operation of the amplifying unit 8 can be regarded as optimal after maintenance, as the value of α remains almost constant independently of the external conditions. On the contrary, the α value of the amplifier 8 waiting for servicing changes considerably depending on the extent and type of load (ohmic or complex).

The obtained diagram illustrates that using the noise measurement according to the invention the devices and systems operating improperly can be prefiltered.

EXAMPLE 3

Figure 5:
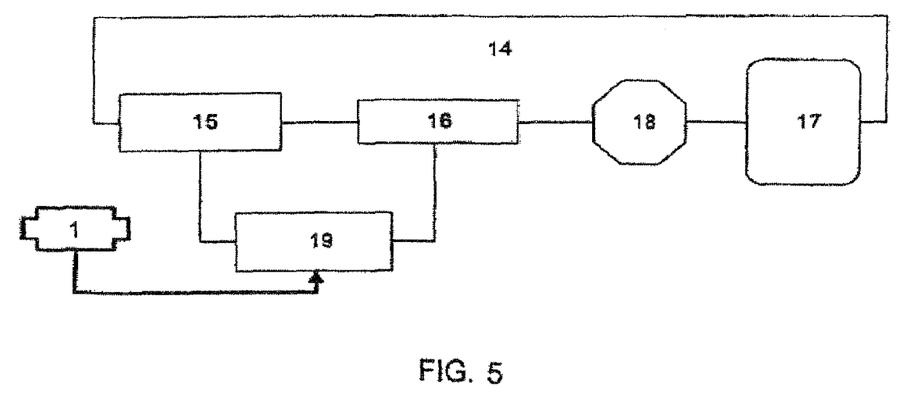
FIG. 5 is a block diagram of an examined water-cooler.

In this example a Peltier-type water cooler 14 illustrated schematically in FIG. 5 was examined by means of the measuring device 1 according to the invention. The water cooler 14 is equipped with a circulation water pump 15 and a heat exchanger 16 containing a Peltier battery and a ventilator. The object 17 to be cooled and the internal measuring unit 18 are connected in series with the water pump 15 and the heat exchanger 16 containing for example a water flow meter. The noise measuring unit 1 was connected to the power supply unit 19, and the power consumed by the water cooler 14 was measured as the signal appearing in the system.

In the course of the measurement one or several components of the water cooler 14 was deliberately put out of order and the change in the exponent α and the consumed power was observed. The latter one can be followed by observing the change of a normalisation factor A appearing in the power density function S(f) (as $S(f)=A\,f^{\alpha}$). The results of the measurement are illustrated in FIG. 7, where the labels denote the following cases G: water cooler 14 with faultless operation,
NV: insufficient operation of the ventilator,
NP: the operation of the Peltier battery is inadequate,
NW: insufficient operation of the water circulating pump,
+: any combination of the above cases.

Figure 6:
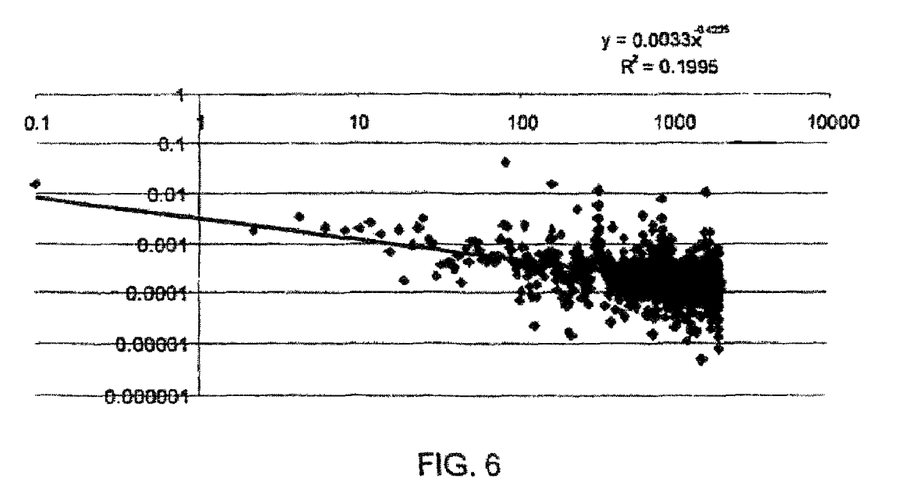
FIG. 6 shows the result of a noise measurement carried out on a water-cooler.

In the example illustrated in FIG. 6, the measurement result for α is shown. The axes of the diagram are of log scale, consequently, the fitting is carried out on the power function. There is no characteristic frequency in this case, although several distinguished frequencies due to the controlling electronics, the circulation and other technical solutions can be observed.

Figure 7:
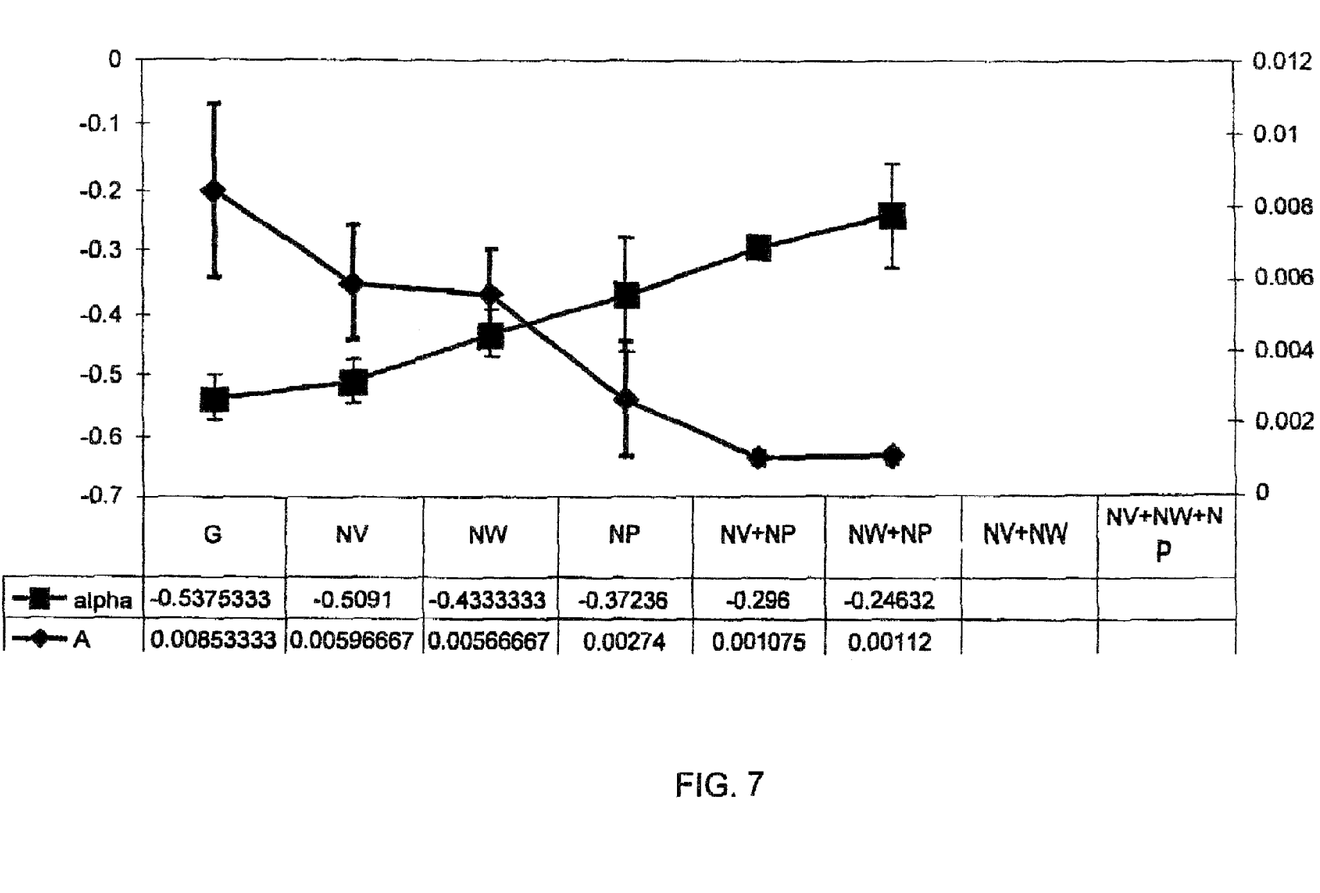
FIG. 7 illustrates the result of noise measurements performed on the water-cooler under different operating conditions.

In FIG. 7 the measured values for the water cooler 14 under different operating conditions are shown. In the column beside the diagram, numerical values of α and A are also listed for each operating condition. Here, 1024 points were adopted per measurement, and after fitting on this set of points the values of α and A were obtained. All points of FIG. 7 are calculated as the average of five measurement results and the deviation from the average is indicated by the vertical error bars.

By observing the change of the exponent α it can be stated that by the gradual aggravation of problems relating to the operation of water cooler 14 the value of α moves away from the value representing the faultless operation (−0.537) measured initially for the system when everything was considered to be all right. At the same time a decrease of the value A related to a decrease in the consumed power can be also observed which indicates that the operation of the device is less and less efficient.

Figure 8:
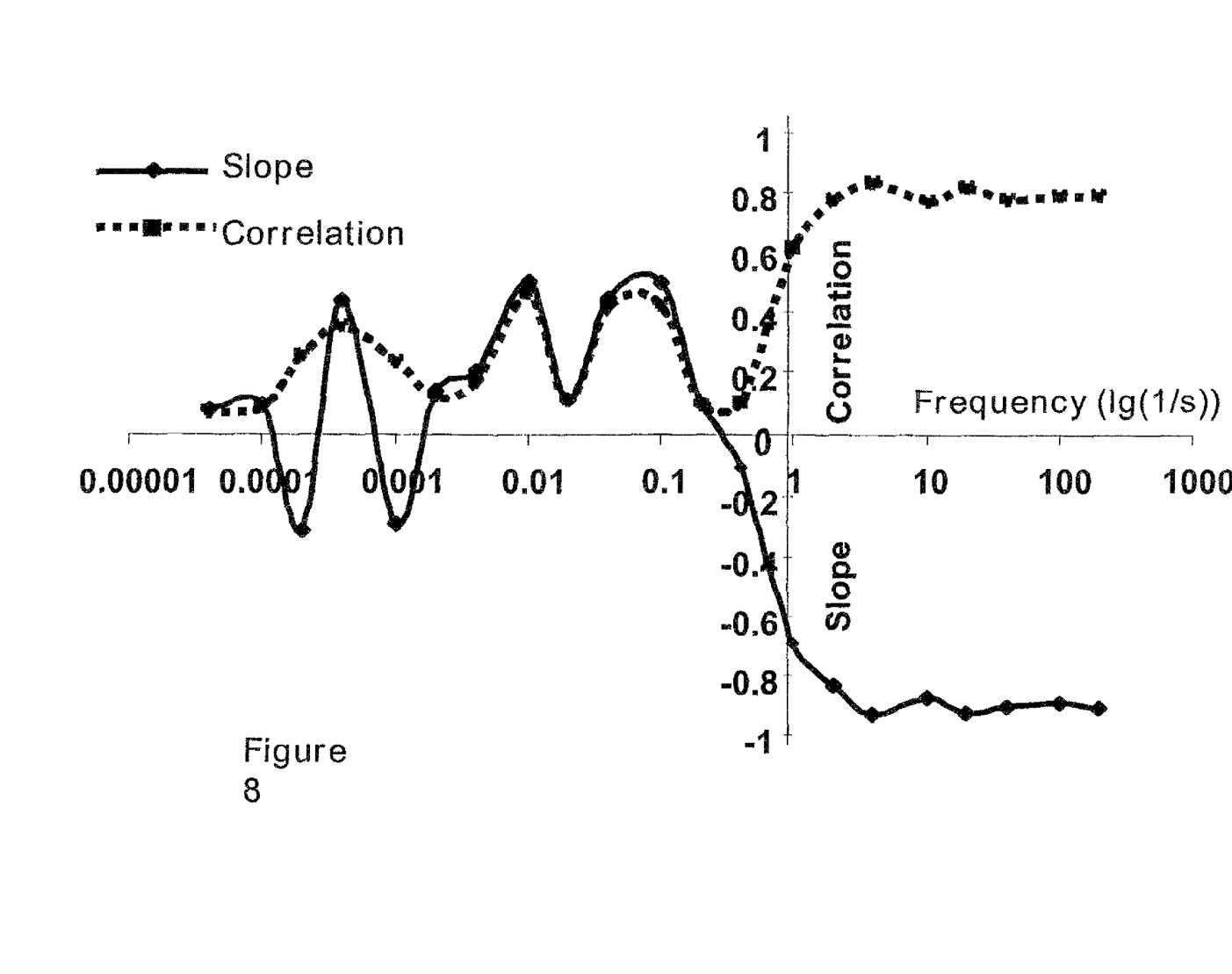
FIG. 8 shows the frequency dependence of the invariant quantity (i.e. the so-called $\alpha$ exponent) characterising the amplifying unit (as a whole) illustrated in FIG. 2 and also the frequency dependence of the correlation value.

The sampling frequency used for the FFT (fast Fourier transform) or other digital Fourier transform is not indifferent with regard to the noise measurement of the invention, meaning that the frequency of retrieving the value of the measured signal produced by the examined system in order to perform the Fourier transform cannot be left out of consideration. The frequency dependence of exponent α was examined in the case of the amplifying unit 8 discussed in Example 1 and operating at 13.56 MHz. The results are shown in FIG. 8. The sampling frequency is represented on a logarithmic scale. The graph of the correlation values is also indicated. It is apparent that when the sampling frequency is substantially smaller than 13.56 MHz, the correlation is also smaller and a very poor exponent α is obtained. The explanation is that the sampling rate is too small with regard to the frequency of the amplifying unit 8, hence it is possible that all sample values come from nearly the same phase while the values corresponding to other phases of the measured signal have been disregarded. It can be seen that over 10 MHz both the exponent α and the correlation becomes stable. Inventors found the sampling rate of 10 MHz to give satisfactory results.

Naturally, the same applies for discrete measuring units 2 but in such cases the frequency of the measuring unit 2 itself has to be taken into account, too.

Figure 9:
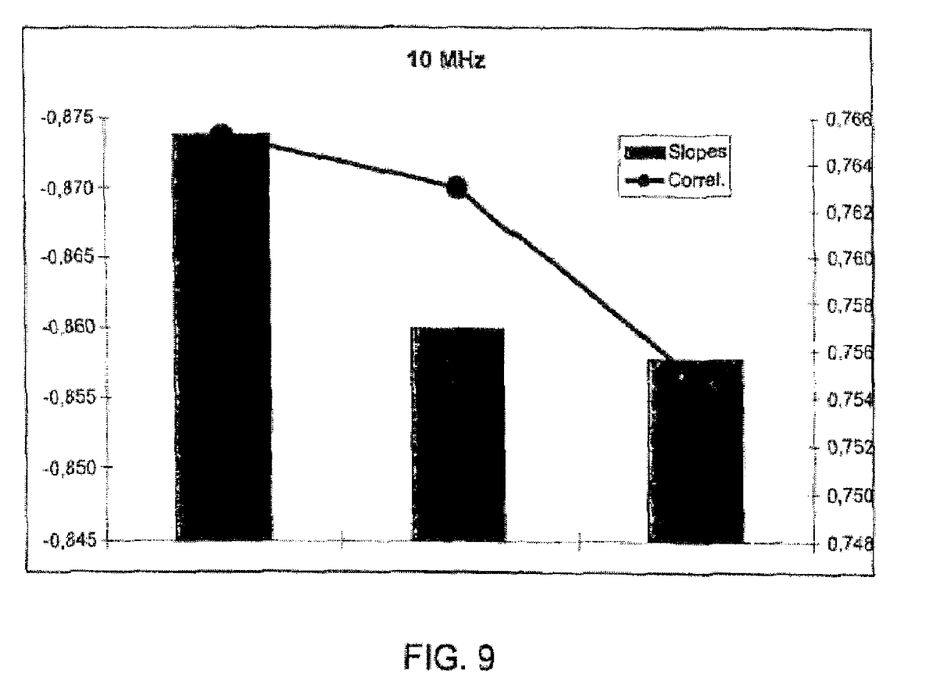
FIG. 9 illustrates the invariant quantity and the correlation value for the amplifying unit of FIG. 2 operating perfectly (first bar) and under two further off-tuned circumstances (second and third bars).

FIG. 9 shows the exponents α and the correlation values for the amplifying units 8 of different conditions. The α values are indicated as bar diagrams and the calculated values can be read off from the left hand side axis. The correlation values are connected and the values corresponding to each amplifying unit 8 can be read off from the right hand side axis. The FFT was performed with a sampling rate of 10 MHz. The left side bar and point correspond to the exponent α and the correlation value of a well operating amplifying unit 8. The two other bars show the noise measurement results for two different, not tuned-in amplifying units 8. No. 1 amplifying unit 8 shown in the middle has a correlation value which is only slightly smaller than that of the well operating amplifying unit 8. The correlation for No. 2 amplifying unit 8 indicated on the right has a much smaller value. Compared to the tuned-in amplifying unit 8, the exponent α is smaller, i.e. decreases for each out-of-tune amplifying unit 8.

One of the possible applications of the measuring device 1 according to the invention is its integration into the system to be monitored (e.g. into the above appliances). By accomplishing continuous measurement and evaluation, it is possible to follow up the aging process of the system. The extent of wearing and tearing can be observed from the change of α, and as the system ages so the value of α moves away from a predetermined reference value taken at an early age of the system. Experimentally, a certain value for α can be predetermined at which inspection and servicing of the system is advisable. For example, the predetermined value of α can be chosen as a given percentage, preferably fifty percentage, more preferably seventy percentage of its initial value determined for the very first time interval considered at the first operation of the system.

By monitoring the change of the exponent α in time, trends indicating breakdowns and wearing can be determined. Based an the curve α(t), i.e. the trend line, a date for a required service/maintenance can be forecast. If abrupt and significant changes can be observed in the behaviour of the curve α(t) as compared to the trend-like change—that is, it has e.g. a discontinuous jump—a particular failure that in general is not in connection with the usual aging process and requires instant servicing is indicated.

Continuous measurement is needed for the specification of unauthorized or unprofessional usage and tampering as well. The abnormal operation of the system is visible in the abrupt change of the curve α(t), and if no permanent damage has occurred, the value of α returns to its original value (or will approximate it) when restoring the system's proper operation.

With the help of the above described noise measurement, abrupt system changes can be perceived allowing for detection of non-appropriate usage or sudden, unpredicted changes in the operating conditions. Naturally, any evolution, which has taken place suddenly and without a history (for example, due to a non-operational, abrupt impact, unexpected event, mishandling factors, etc.) cannot be traced back with the present invention. However, since these sudden errors are most likely to be due to other factors than normal, prescribed operation of the system (that is, they are due to new effects that formally did not play a role in the dynamical operation of the system), the unauthorised, non-trained, unprofessional, illegal use or such operational errors that are caused by the handling person when using the system in an incompetent way or altering the operating conditions unprofessionally can be detected. This method allows for the detection of tampering (unauthorised technical examination of the system) or unauthorised re-installation if any of the dynamical parameters have changed leaving a trace in a measurable noise spectrum. Accordingly, errors accompanied by a noise spectrum with sudden changes or without an appropriate noise history generally indicate mishandling/environmental/vis major situations. These can be filtered out by observation and continuous monitoring of the noise spectrum (e.g. collecting noise spectrum data regularly by means of a computer).

When using the noise measuring device 1 in design-development processes, it is possible to determine the extent of equilibrium in the established complex system: if any of the dynamical partial actions or structural elements participate in the operation of the system with a higher dominance than in the ideal case of a system operating at an equilibrium with only a necessary redundancy, the noise spectrum will increasingly deviate from the harmonic behaviour of 1/f, and the same is true for the value of α with regard to the expected (−1) as well. By measuring continuously or intermittently the exponent α, the process according to the invention allows for the optimisation of planning.

Apart from development, the noise measurement of the invention can also help in evaluating and installing the final equipment or system. During installation or reinstallation determining the α parameter could be adequate for the testing of the final assembly. If the value of α has reached a predetermined value, meaning that the system has been successfully created or it is advantageously sufficiently near to (−1) indicating that the system can be regarded as ideal, one can be certain of the proper global function characterising the system as a whole and in its entirety without having to check the constituting elements.

In certain embodiments the measuring device 1 can be remote controlled and can interact with the system by means of the actuating unit 6. Generally, all systems have calibration parameters that should be reset due to changes occurring during the course of operation. For example, in Example 1 the amplifying unit 8 is tuned to the resistance of 50 Ohm, which is achieved by adjusting the position of a rotary capacitor and/or a potentiometer. However, during use, it might be necessary to tune the amplifying unit 8 to a different load, or to have it re-tuned (e.g. due to aging). The actuating unit 6 could be suitable for adjusting the rotary capacitor or the potentiometer. By carrying out the noise measurement of the invention at different positions of the rotary capacitor and the potentiometer, the most optimal α value can be established and hence in this way the amplifying unit 8 can be tuned automatically through the actuating unit 6. This tuning method can be remote controlled or pre-programmed, and the procedure can be fully automated.

A further possible application is the control of renovation, improving, upgrading activity. Instead of changing an equipment of high value and/or of restricted location/building/infrastructure it is usually renovated/upgraded. Similarly, upgrading is an inherent necessity of electronic and high-tech developments even in the case of smaller modern devices since it would be rather expensive to change the device in order to keep up with the pace dictated by the fast development rate. However, the modules/components/appliances built in during renovation or upgrade are more modern than the parts they are substituting, might have substantially better properties, meaning that substituting parts manufactured by technologies other than the original parts have to be built in. In the case of such replacements, the compatibility of the components can present a considerable risk. The new part is compatible with regard to its form and compatible with the directly connected interface, however, any hidden incompatibility problems will only show up during the course of operation, may be only after substantial damage has been caused. This is a serious problem increasing with the spreading of modern electric equipments made up from interconnected modules, with the creation of remote service technique and the demand for compatible modular structure.

The noise measurement of the invention, however, allows for the control of such complex systems and proper compatibility can be assured. By measuring the exponent α for the system both before and after the upgrade/replacement, a compatibility measure for ranking a replacing part can be specified via subtracting the second value of α from the first value of α. On basis of the measure deduced, hidden incompatibility problems can be detected and corrected straight away, since the upgrade of the system should be generally accomplished only in case of a positive compatibility measure. This is particularly important in case of modular equipments (e.g. computers and peripheries), where compatibility has to be checked otherwise it could completely block the use of the system.

In case of the examples presented here inventors examined the internal noise of the systems, that is, passive noise measurement was carried out. However, it is possible that the intensity of passive noise measurement is not adequate (particularly for systems operating under extra high noise suppression), and in this case it is possible to "screen" the system by using active noise source. This means that an external noise source is connected to the system, and the changes occurring in relation to the spectrum of the added noise is monitored by the noise measuring device 1. If the system is not complex enough but has cyclic variables, it will act as a filter in response to white noise, and can indicate the system's adequacy or operational faults with a special sample-test response. (See P. Szendro, G. Vincze, A. Szasz: Bio-response to White Noise Excitation, Electro- and Magnetobiology, 20:215-229, 2001). Similarly to what has been said, faults or near-faulty states can be detected from the noise spectrum.

The measuring device 1 according to the invention can be used to examine practically any kind of system, as a whole and in its entirety, releasing measurable signal during operation or as a response to external noise source. In the above Examples the inventors were measuring voltage signals produced by an amplifying unit 8 and a water cooler 14; then the voltage signals were directly subjected to a Fourier transform; then the power density functions were calculated and power functions were fitted; and finally the exponents α were determined. To make it more simple, the inventors fitted a linear function on the logarithm of the power function, and the exponents α were obtained as slopes.

In case of electric appliances it is practical to measure the power input or output and examine it using the method according to the invention. It is however possible that depending on the actual application other signal would be carrying more relevant information with regard to the aim of the examination.

It can be generally said that one should preferably measure the signal that is the most descriptive for the system as a whole (e.g. the power consumption for a cooling device) or the signal that can be most effected by the introduction or possible introduction of a new component (e.g. testing during development, or upgrading or component replacement).

EXAMPLE 4

The aim is to upgrade a computer from PCBs (Printed Circuit Boards) and to estimate whether the planned upgrade would improve or degrade the operation of the computer.

(1) Changing to consumer electronics with bigger consumption. First, the power consumption is examined with the measuring device 1 in case of the original consumer, meaning that the input power is measured as described in the water-cooler's 14 example and the exponent α characteristic to the system is calculated. The original consumer is then replaced with the new one and then by means of the measuring device 1, a new α value is sought for the new system. By comparing the α values obtained with the original and the new consumer it can be decided whether or not it is worth to change the consumer. If e.g. the new α value is closer to (−1) than the former one, the global function of the computer has improved through the replacement, while in the opposite case it is advisable to try again with a different consumer. A decision for upgrade can be also made on basis of the compatibility measure defined before.

(2) Upgrading the computer with a new graphics card. Since the graphics card does have no substantial influence on the power consumption, it would be difficult to determine the effect of the graphics card therefrom. Nevertheless, the clock signal could change measurably when installing the new graphics card; it is therefore more advantageous to measure the clock signal with the device 1 of the invention. The $\alpha$ values obtained with and without the new graphics card can be compared and it can be seen how the operation of the computer would change.

(3) A graphics card is sought that is the most fitted to co-operate with the already assembled parts of the computer in the design-development stage. The $\alpha$ value is measured in the above described way for various graphics cards and the one which gave an $\alpha$ value best approximating an experimentally pre-determined ideal value, preferably the value of (−1) is to be chosen.

In case of non-electric systems, the mechanical or other kind of signal is advantageously converted into a voltage (or a current) signal. For example in the case of mechanical signals known types of piezo-crystal means or stroboscopic signal converters could be used, or other effects accompanying the mechanic movement could be measured (e.g. gate examination, examining creep or displacement).

For example, when bearings (annular, cone, ball and socket, etc.) are to be tested, known techniques seek to determine the characteristic frequencies, that is, detect any outstanding frequencies in the spectrum, which could indicate a crack in the bearings. Opposed to the known technique, the noise measurement of the invention allows for a global insight as to the state of the bearings by calculating one single parameter, which means a significantly faster, as well as more easily automated measurement and analysis. Any known measuring means designed for testing bearings can be used as the measuring unit 2.

Further possibilities of application will now be described, which, in combination with the above said information, will be easily put in practice by a person skilled in the art.

In Example 2 it was shown that the exponent $\alpha$ of the amplifying unit 8 needing service strongly depended on the external conditions (that is, on the applied load at the output), whereas after maintenance the optimally functioning amplifying unit 8 had a stable $\alpha$ value independent of the external conditions. This is the case not only for the amplifying unit 8. The phenomenon can be made use of in relation with any product to which the noise measurement of the invention can be applied. For example, in case of mass production, faulty products can be easily filtered from good ones by measuring the stability of the $\alpha$ value.

The noise measurement method and noise measuring device 1 according to the invention are also suitable for health monitoring of buildings, for example after natural disasters, such as earthquakes, tornados, landslides. The health monitoring may be conducted by applying artificial shocks via known vibration machines for example, and, like in case of known health monitoring, by measuring the vibration of the structure. As opposed to the known examination techniques, the inventors do not seek to detect outstanding signals (characteristic frequencies). Instead, the aim is to monitor any change occurred in the $\alpha$ value and to determine the extent of damage caused in the building's structure therefrom. For this purpose initial measurement results should be collected beforehand. Such reference measurements are advantageously conducted before opening of the building.

Health monitoring can be necessary in the case of practically any kind of equipment. As an example, equipments can be mentioned where measuring the noise of the input power could be used to predict the health condition of the equipment like in the case of the water cooler 14. Such equipment can be a hard disk drive, a PC, a DC fan, a TMP (turbo-molecular pump), a RP (rotary pump), etc. In case of electric circuit board elements it is usually recommended to measure the noise of the current flow or the voltage signal. That is the case for the LSI testers, which cannot be evaluated by electronic testers if some contaminants are adhered to the surface of the circuits.

The noise measurement method and noise measuring device 1 according to the invention can also be used for examining biological systems. The aforementioned principles about long-term correlations equally apply to complex biological systems (such as human or animal body) just like to electric, mechanical, or other kind of non-biological systems. Biological systems are also capable of emitting different signals (e.g. physiological signals) and the noise (that is, the fluctuation) of such signals, similarly to the above-described systems, carries global information related to the biological system as a whole.

In what follows some further simple examples will be discussed, from which further possibilities of medical or diagnostic application of the method or device according to the invention will be apparent to a person skilled in the art.

EXAMPLE 5

Human/Veterinary Health Monitoring by ECG

In this case the complex biological system is the human (or animal) body and the output signal is the heartbeat, which can be measured in a known way via an ECG (electrocardiograph). ECG devices draw out the measured signal or transmit them in digital format, e.g. to a computer. In all cases the measured signal is transformed into a voltage signal which can be easily coupled out. This electric signal is led to the input of the measuring device 1 of the invention, which can be the measuring unit 2 or even the Fourier analyser 3 performing the Fourier transform. The input signal, as is received, will then be Fourier transformed by the analyser 3, after which one can obtain the exponent $\alpha$ by fitting a linear function on the measured points represented on a logarithmic scale. By regularly repeating the noise measurement of the invention, it can be determined from the change of the $\alpha$ value whether the general health condition of a patient is improving or worsening. If the $\alpha$ value moves closer to the value of (−1), the health condition of the patient is improving, while if $\alpha$ moves away, it's worsening. It must be emphasized that the noise measurement of the invention will supply information on the patient as an entire biological system, thus through the noise measurement performed on the ECG signal information is not only obtained on the heart action but effects of internal changes that would not yet be recognizable in other ways can also be detected. For instance, if a significant aggravation is detected in the patient's $\alpha$ value, a general health examination is recommended even if there are no complaints as yet, since the aggravation of the $\alpha$ value could predict developing illnesses. Similarly, during the course of curing chronic illnesses regular noise measurement can help in determining whether the cure is effective even before any signs of improvement would be visible.

Similarly to what has been said before, the stability of $\alpha$ could also be monitored instead of watching out for changes in its value. ECG measurements can be performed under different conditions (ECG at rest, ECG during exercise) to see the extent of dependency of the external conditions in the $\alpha$ value. As shown in the case of the amplifying unit 8, the $\alpha$ value of a well operating system is independent of the external load or conditions, that is, it remains nearly constant. It is possible to use a known kind of 24 hours ECG monitoring device (Holter monitoring), which is attached to the examined person during the whole of the day. In case of known examination techniques, it is required that the examined person note his or her activities during the day, since this is needed to determine whether the measured ECG could be regarded as normal for certain activities. The obtained ECG has to be analysed with regard to the patient's diary, which is a time consuming and often unnecessary task. Instead, the 24 hours ECG monitoring device can be incorporated in the above-mentioned one-chip PC embodiment of the noise measurement device 1 according to the invention, which can calculate the $\alpha 0$ value with a given regularity. The person evaluating the ECG results would then take a look at the $\alpha$ values, and if the $\alpha$ values are found to have been approximately constant, the examined person's good health condition could be affirmed without the need of further investigation of the ECG results.

Instead of using ECG, any signal produced by humans or animals can be examined. Holter monitoring devices are also directed to blood pressure measurements, but gastric acid or urine can be equally examined. There are numerous medical diagnostic devices that can be used by a person skilled in the art for measuring and converting different biological/physiological signals into voltage signals. It is possible for example, to perform noise analyse on breath or pulse rate.

A wide range of possible examinations is available. For instance, it is possible to analyse the measurement results of brain cell activity or splanchnic or other activity. For example, brain cells can be illuminated by near infrared light and the measured reflected optical signals or rather the noise superimposed thereon are suitable for examining the brain activity. An $\alpha$ value significantly differing from the value of $(-1)$ indicates a sick brain activity.

However, totally different kind of "signals" can equally be measured, like comfort rate (hunger, needs, etc.) due to lack of treatment in case of elderly people can also form the basis of the noise measurement of the invention. A known measurement consists in measuring the rate or length of strides during walking, the noise of which can also provide the exponent $\alpha$.

EXAMPLE 6

Special applications are also possible, such as monitoring health condition of an automobile driver during driving. A 24-hour ECG monitoring device can be used in this case too, but less disturbing measurements are also available. For example, it is possible to detect the eye movements of the driver via a camera recording every movement of the iris as a noise-spectrum. Such devices are available and are easily modified by a person skilled in the art in such a way that the electric signals of the device can be evaluated according to the invention. The obtained $\alpha$ values can be used to determine if the driver is tired. With appropriate personal calibration, a threshold $\alpha$ value can be determined which when reached means that the level of alertness is no longer adequate and the driver should preferably stop for a break.

Weariness can also be detected from measuring the miographic signs (muscle-electric signs) of the hand/leg/body, which measurements are known to a person skilled in the art, and which can be analysed similarly. An effective way of measuring weariness can consist in stimulating the driver to react actively and examining the response. The stimulus can be artificial (constraint to act according to a given signal) or natural (order of movements when taking a road bend). The noise measurement can consist in examining the reaction.

Similar methods can be applied for determining weariness/sickness/age of moving life beings, including the method of noise measurement performed on a pre-chosen detail of a high-resolution video recording.

Similar to the case of examining the reaction to an exterior stimulus of a driver, the reaction and the reaction's relaxation of humans or animals can be examined in other fields, too. The measuring of this type of physiological signals and converting them into electric signals is also known from the art, thus the noise measurement of the invention can be performed on the obtained electric signals. Instead of physiological measurements, pH- or other chemical measurements can be also suitable, the noise of which can be examined as described above.

It can be generally stated that the possible measurements for practically any kind of systems are nowadays performed with devices having sensors registering all happenings (be it of mechanical, chemical, biological, cosmic, electromagnetic, nuclear, etc. nature) and converting them into electric signals, the device being directed to the analysis of such electric signals. In case of parallel input information these are sorted according to certain considerations and are analysed, stored and displayed accordingly (e.g. video recording). The measuring device 1 of the invention can be best applied when an electric signal is already at hand. The specific appliance converting the measured signal into electric signal can depend on the application, and will be apparent from the present description to the person skilled in the art, who will then be able to choose an adequate appliance and make minor modifications, if necessary, in order to couple out the electric signal and to conduct it to the measuring device 1 of the invention. It is important that the appliance used for the measurement should have an output, that is, it should be possible to transmit the information in electrical form for further processing. A group of embodiments of the measuring device 1 according to the present invention incorporates a known measuring means which has been modified so as to transmit the electric signal of the measuring means to the analyser 3 performing the Fourier transform (which can, as seen above, be incorporated in a computer 4 or any other digital signal processing unit). In this case the modified measuring means can replace the measuring unit 2, however in certain cases a unit for receiving the electric signal can be used to connect the measuring means with the analyser 3, or in certain cases the measuring unit 2 can perform this function.

The invention claimed is:

1. A measuring device for measuring and evaluating a measurable signal emitted by a system being investigated during operation or in response to an external excitation, the device comprising a signal receiving unit, an output unit, and an evaluating unit comprising means for Fourier transforming the time dependant signal captured by the receiving unit and characteristic of the system as a whole, said signal being transformed directly as captured, means for calculating the power density function of the Fourier transform, means for calculating an invariant quantity characteristic of said system as a whole in the form of the exponent $\alpha$ of said power density function versus the frequency, means for providing data indicative of the invariant quantity obtained to the output unit.

2. The measuring device of claim 1, wherein the evaluating unit is incorporated into a PC, a one-chip PC, a microchip or a micro-controller.

3. The measuring device of claim 2, wherein the output device is a display unit (5) for displaying the data indicative of the invariant quantity obtained.

4. The measuring device of claim 3, wherein the signal receiving unit is a measuring unit (2) adapted for converting the system's measurable signal into an electric signal and for registering said converted signal.

5. The measuring device of claim 4, wherein the system's measurable signal is at least one of a voltage signal and a current signal, and the measuring unit (2) is adapted for registering at least one of the system's voltage and current signal.

6. The measuring device of claim 4, wherein the signal receiving unit is a voltmeter connected to an external unit for converting the system's signal into a voltage signal.

7. The measuring device of claim 4, wherein the signal receiving unit is a measuring unit (2) adapted for measuring the input or output power of the system being investigated.

8. The measuring device of claim 4, wherein the system's measurable signal is a mechanical, optical, biological, chemical, nuclear or other physical or biophysical signal.

9. The measuring device of claim 4, further comprising means for comparing the invariant quantity with a pre-given constant.

10. The measuring device of claim 2, wherein the output device is an actuating unit (6) for acting upon the system in harmony with the data indicative of the invariant quantity obtained.

11. The measuring device of claim 10, wherein the signal receiving unit is a measuring unit (2) adapted for converting the system's measurable signal into an electric signal and for registering said converted signal.

12. A method for measuring and evaluating a measurable signal emitted by a system being investigated during operation or in response to an external excitation, comprising the steps of capturing the system's time dependant signal characteristic of the system as a whole, evaluating via one of a PC, a one-chip PC, a microchip or a micro-controller said signal comprising Fourier transforming said signal in its captured form, calculating the power density function of the Fourier transform, and calculating an invariant quantity characteristic of said system as a whole in the form of the exponent $\alpha$ of said power density function versus the frequency, transmitting said invariant quantity to further processing, and displaying the signal thus measured.

13. The method of claim 12, wherein the system's signal is a non-electric signal, in particular a mechanical, optical, biological, physiological, chemical, nuclear or other physical or biophysical signal, and the step of capturing said signal includes converting the signal into at least one of a voltage and a current signal.

14. The method of claim 13, including utilizing a fast Fourier transform for Fourier transforming the signal.

15. The method of claim 14, comprising calculating the invariant quantity as the slope of a linear fitted to the logarithm of the power density function versus the logarithm of the frequency.

16. The method of claim 12, wherein the step of further processing comprising at least one of displaying the invariant quantity and making use of the invariant quantity for acting upon the system being investigated.

17. The method of claim 12, comprising executing the capture of the system's signal in a plurality of different time intervals of given lengths, calculating an invariant quantity on basis of the respective signal for each of the intervals, using said sequential invariant quantities for constructing a trend line representing the temporal evolution of the system's condition, and predicting the time of servicing or maintenance of the system based on said trend line by choosing the instant as the time of servicing or maintenance at which the extrapolation of the trend attains a predetermined value of the invariant quantity.

18. The method of claim 17, comprising defining the predetermined value of the invariant quantity as a given percentage of the invariant quantity determined for the very first time interval considered at the first operation of the system under study.

19. The method of claim 12, wherein the system is built up of a plurality of subsystems coupled to one another and is characterised by a first invariant quantity, comprising preparing a modified system by replacing at least one of said subsystems with a subsystem of identical function, calculating a second invariant quantity characteristic of the modified system on basis of a measurable signal emitted by said modified system, comparing said invariant quantities to one another, and specifying a compatibility measure for ranking the subsystem used as replacement via subtracting the second invariant quantity from the first invariant quantity.

20. The method of claim 19, further comprising an optional upgrade of the system by installing said subsystem used as replacement to the system instead of the subsystem earlier replaced thereby if said compatibility measure is positive.

21. The method of claim 12, comprising operating the system under various conditions described each by a given set of system parameters, capturing the system's signal under each operation condition, calculating the invariant quantity on basis of the respective signal for each operation condition, and defining the system's optimal operating condition by choosing the set of system parameters corresponding to the invariant quantity best approximating the value of minus 1.

22. The method of claim 21, comprising examining the stability of the invariant quantity obtained for the various working conditions.

* * * * *